US008775980B2

(12) United States Patent
Salama et al.

(10) Patent No.: US 8,775,980 B2
(45) Date of Patent: Jul. 8, 2014

(54) TRENCH SILICIDE MASK GENERATION USING DESIGNATED TRENCH TRANSFER AND TRENCH BLOCK REGIONS

(71) Applicants: Mohamed Salama, Poughkeepsie, NY (US); Marc L. Tarabbia, Pleasant Valley, NY (US)

(72) Inventors: Mohamed Salama, Poughkeepsie, NY (US); Marc L. Tarabbia, Pleasant Valley, NY (US)

(73) Assignee: Globalfoundries, Inc., Grand Cayman (KY)

( * ) Notice: Subject to any disclaimer, the term of this patent is extended or adjusted under 35 U.S.C. 154(b) by 0 days.

(21) Appl. No.: 13/686,203

(22) Filed: Nov. 27, 2012

(65) Prior Publication Data
US 2014/0149952 A1    May 29, 2014

(51) Int. Cl.
*G06F 17/50* (2006.01)
(52) U.S. Cl.
USPC ............................................................. 716/52

(58) Field of Classification Search
USPC ............................................................. 716/52
See application file for complete search history.

(56) References Cited

U.S. PATENT DOCUMENTS

| | | | |
|---|---|---|---|
| 2005/0148173 A1* | 7/2005 | Shone | 438/672 |
| 2007/0057302 A1* | 3/2007 | Ho et al. | 257/301 |
| 2007/0218625 A1* | 9/2007 | Ho et al. | 438/243 |
| 2012/0171861 A1* | 7/2012 | Park et al. | 438/639 |
| 2013/0175615 A1* | 7/2013 | Uhlig et al. | 257/339 |

* cited by examiner

*Primary Examiner* — Vuthe Siek
*Assistant Examiner* — Mohammed Alam
(74) *Attorney, Agent, or Firm* — Ditthavong & Steiner, P.C.

(57) ABSTRACT

A method for designating TT and TB regions utilizing designated TS regions, without fully generating TT and TB features, and thereafter fabricating TS regions utilizing the designated TT and TB regions, is disclosed. Embodiments include: determining a TS having a placement and shape, the TS shape having a first horizontal dimension and a first vertical dimension; determining an active region including the TS; determining an extended TS including the TS and an extension portion in the horizontal and vertical directions, adjacent each edge of the TS; and determining a TB region based on the active region and the extended TS.

20 Claims, 8 Drawing Sheets

TRENCH SILICIDE MASK GENERATION USING DESIGNATED TRENCH TRANSFER AND TRENCH BLOCK REGIONS

TECHNICAL FIELD

The present disclosure relates to a generation of a trench silicide (TS) using a designated or drawn trench transfer (TT) region and trench block (TB) region in an integrated circuit (IC) design. The present disclosure is particularly applicable to gate last processes utilizing double patterning technology (DPT) in 20 and 14 nanometer (nm) technology nodes and beyond.

BACKGROUND

TS formation using DPT allows different exposures to decompose TT and TB features within a single layer. Traditional methods typically generate TT regions based on active regions and TB regions based on gate electrode shapes without designating or drawing the features before fabrication because determining (i.e., fully designating or drawing) TT and TB features is overly complicated to implement. As such, traditional methods frequently utilize designs without TT and TB features designated or drawn for fabrication. However, generating TT and TB regions makes design rule checks (DRC) checks difficult as the generation code is complex and not very robust, leading to mask rule check (MRC) and optical rule check (ORC) problems. These, in turn, could lead to TS to gate electrode shorts, rendering the fabricated design unsuitable for an intended use.

A need therefore exists for a less complex methodology enabling formation of TS with DRC checking

SUMMARY

An aspect of the present disclosure is method of determining a TB region based on a drawn TS.

Another aspect of the present disclosure is a method of fabricating a device by forming a mask (e.g., a TB region) covering an entire upper surface of gate electrodes and being outside of a region between the gate electrodes (e.g., a TS).

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: determining a TS having a placement and shape, the TS shape having a first horizontal dimension and a first vertical dimension; determining an active region including the TS; determining an extended TS including the TS and an extension portion in the horizontal and vertical directions, adjacent each edge of the TS; and determining a TB region based on the active region and the extended TS.

Some aspects include determining a rectangular extended active region including the active region and the extended TS. Additional aspects include a method, wherein the TB region includes the rectangular extended active region minus the extended TS. Further aspects include a method, wherein the rectangular extended active region is the smallest rectangle that encompasses both the active region and the extended TS. Some aspects include determining one or more gate electrode regions each having a second vertical dimension, wherein the extended TS has a third vertical dimension greater than the second vertical dimension. Additional aspects include a method, wherein the TB region indicates a region for a deposition preventing etching of the one or more gate electrodes regions during a formation of the TS. Further aspects include a method, wherein the active region has a second vertical dimension equal to the first vertical dimension of the TS. Some aspects include a method, wherein the TS is designated for exposure by a first mask in a layer, and the TB region is designated for exposure by a second mask in the layer. Additional aspects include determining whether the TS and/or the TB region cause a design rule check (DRC) error.

Another aspect of the present disclosure is a method including: forming first and second gate electrodes on a substrate; providing a mask on the substrate, the mask covering an entire upper surface of each of the first and second gate electrodes and an extension portion adjacent each edge of each of the first and second gate electrodes and having an opening in a first region of the substrate between the first and second gate electrodes; and forming a TS, after providing the mask, in the first region, wherein the mask is configured to block the TS from forming on portions of the substrate covered by the mask.

Aspects include forming the TS in a portion of the first region which is also a portion of a second region of the substrate, the second region including a rectangular area overlying a portion of the mask and a portion of the first region. Additional aspects include a method, wherein the second region excludes a portion of an area between the facing sides of the first and second gate electrodes. Further aspects include a method, wherein the second region is a TT region corresponding to an active region associated with the first and second gate electrodes. Some aspects include: removing the mask, after formation of the TS; and forming a metal salicide in the TS, after removal of the mask, by depositing a metal reacting with the substrate through a thermal anneal operation. Additional aspects include a method, wherein the TS is formed in an area corresponding to a drawn TS region associated with the first and second gate electrodes. Further aspects include a method, wherein the mask is a TB associated with the first and second gate electrodes.

Another aspect of the present disclosure is a method including: determining a TS having a placement and shape, the TS shape having a first horizontal dimension and a first vertical dimension; determining an active region including the TS, the active region having a second vertical dimension equal to the first vertical dimension of the TS; determining an extended TS including the TS and an extension portion in the horizontal and vertical directions, adjacent each edge of the TS; and determining a TB region based on the active region and the extended TS.

Aspects include determining a rectangular extended active region as a smallest rectangle that encompasses both the active region and the extended TS, wherein the TB region comprises the rectangular extended active region minus the extended TS. Some aspects include determining one or more gate electrode regions each having a third vertical dimension, wherein the extended TS has a fourth vertical dimension greater than the third vertical dimension, wherein the TB region indicates a region for a deposition to prevent etching of the one or more gate electrodes regions during a formation of the TS. Further aspects include a method, wherein the TS is designated for exposure by a first mask in a layer, the TB region is designated for exposure by a second mask in the layer, the method further including determining whether the TS and/or the TB region cause a DRC error.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of unknown and significant design errors attendant upon forming TS by generating TT and TB features. In accordance with embodiments of the present disclosure, the problems are solved, for instance by, inter alia, determining a TT and TB region to enable a DRC check of the determined TT and TB regions before fabrication (e.g., during a layout step, decomposition step, etc.).

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 8:
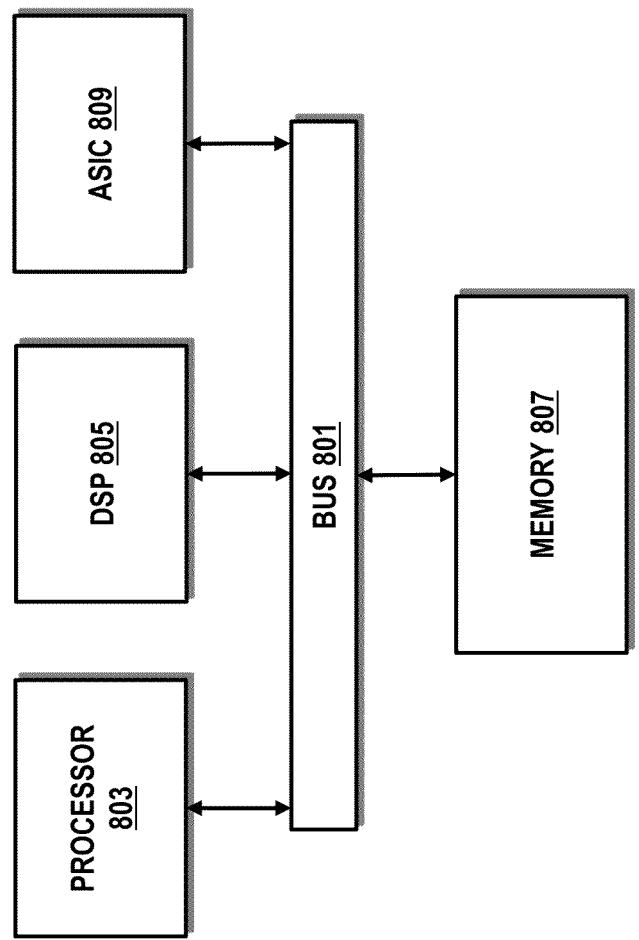
FIG. 8 is a diagram of a chip set that can be used to implement exemplary embodiments.

FIGS. 1 through 4 illustrate a methodology for determining, by for example, the chipset described in FIG. 8, of designated (or drawn) TT and TB regions using a drawn TS. Adverting to FIG. 1, a user interface 100 indicates gate electrodes 101, on an active (RX) region 103 of a substrate, being separated by drawn TS 105. The drawn TS 105 may be used to form a trench for opening source/drain (S/D) regions. As shown, the drawn TS 105 has a horizontal dimension 107 and a vertical dimension 109 and the RX region 103 has a vertical dimension 111 equal to vertical dimension 109. The RX region 103 may be a designated TT region.

Figure 1:
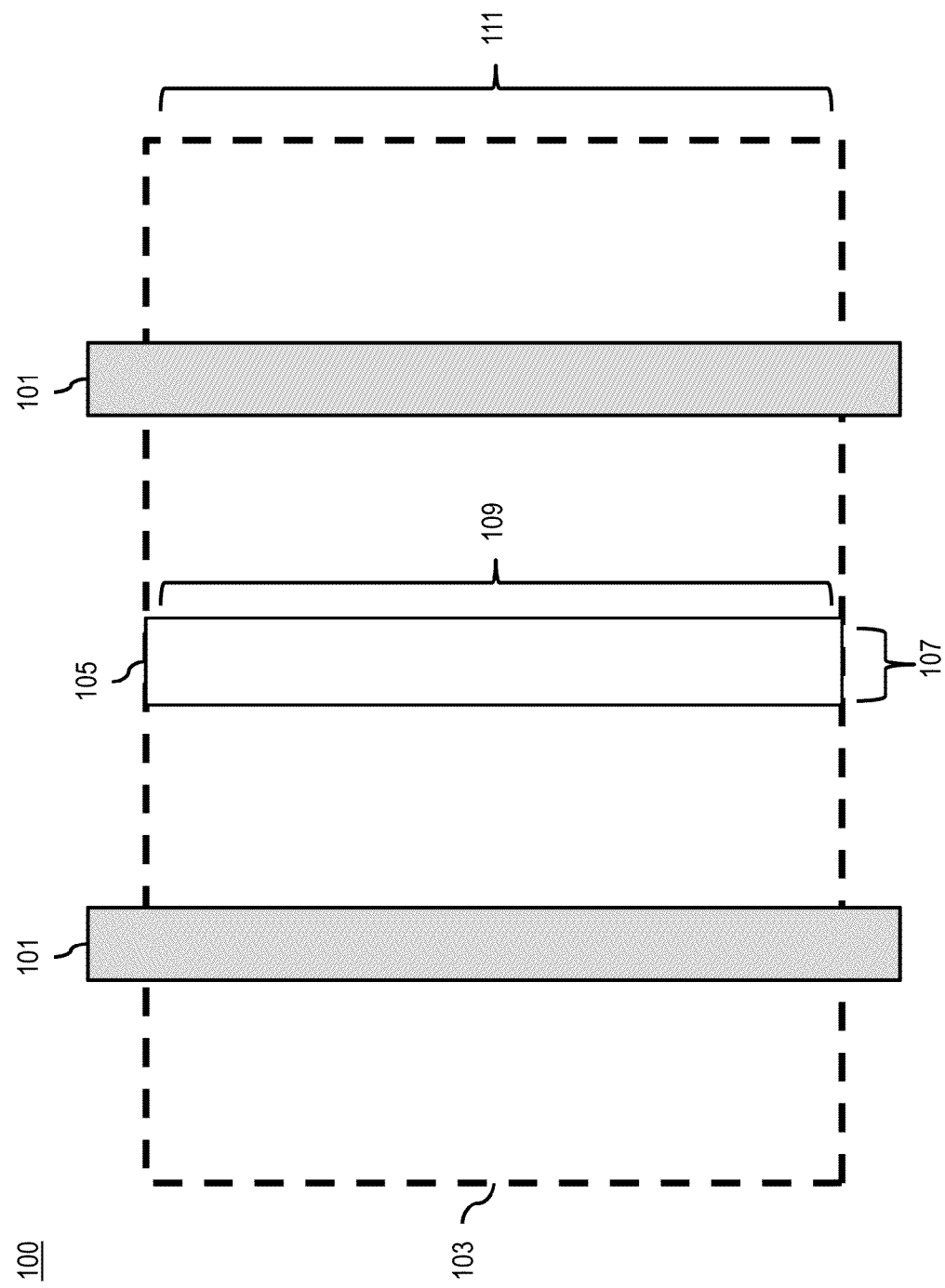
FIGS. 1 through 4 schematically illustrate a designating of a TT region and TB region, in accordance with an exemplary embodiment.
Figure 2:
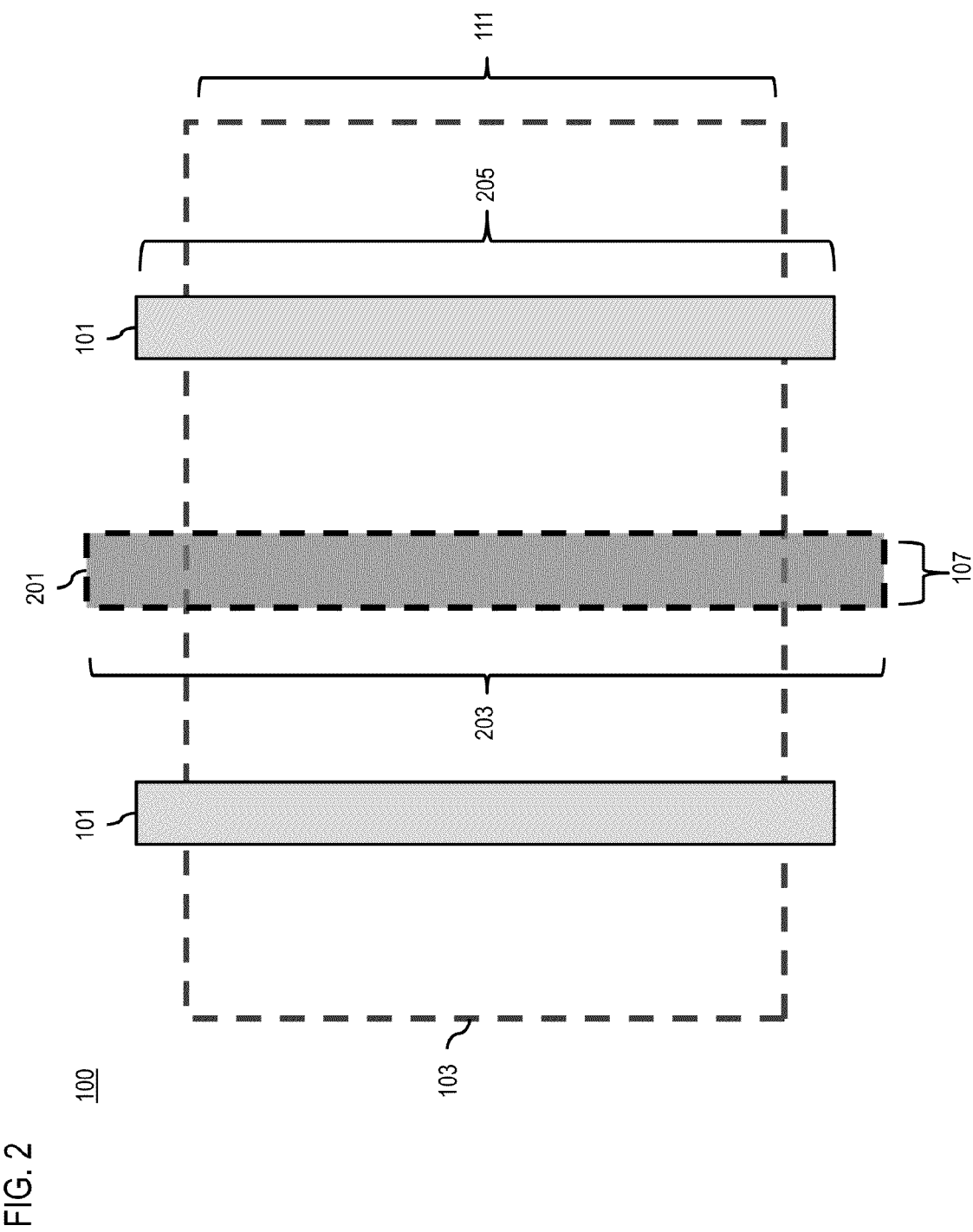

As illustrated in FIG. 2, an extended TS 201 includes the drawn TS 105 (not shown) and an extension portion in the horizontal and vertical directions, adjacent each edge of the drawn TS 105. The extension portion may be based on a corner rounding tolerance of gate electrodes 101, etch shrinkage, and a critical dimension relating to decomposition of TB. As shown, the extended TS 201 has a vertical dimension 203 greater than a vertical dimension 205 of gate electrodes 101.

Figure 3:
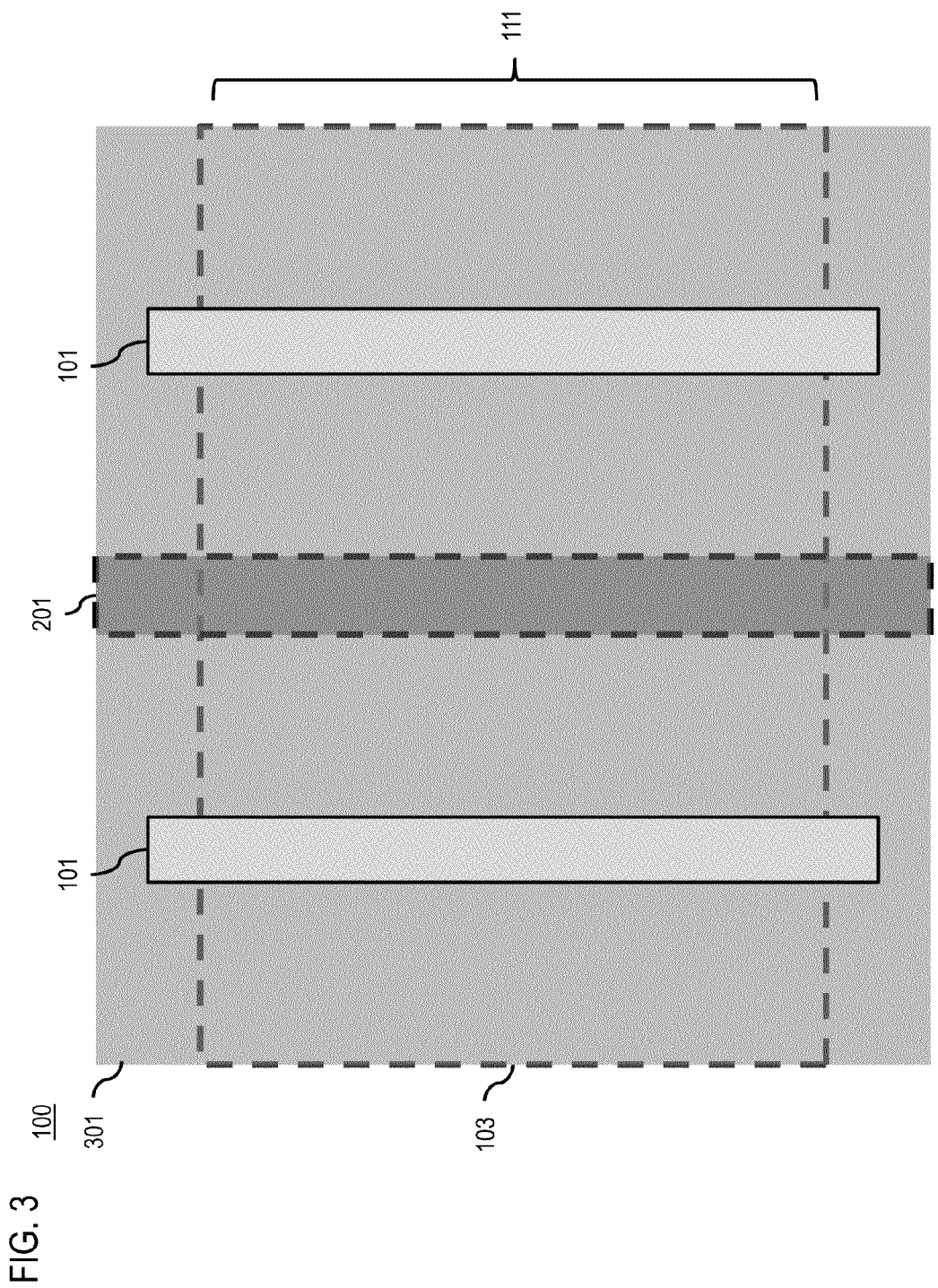

As shown in FIG. 3, a rectangular extended active region 301 including the RX region 103 is determined based on the extended TS 201. The rectangular extended active region 301 is the smallest rectangle that encompasses both the active region 103 and the extended TS 201. In other words region 301 has the same horizontal dimension as RX region 103 and the same vertical dimension as extended TS 201.

Figure 4:
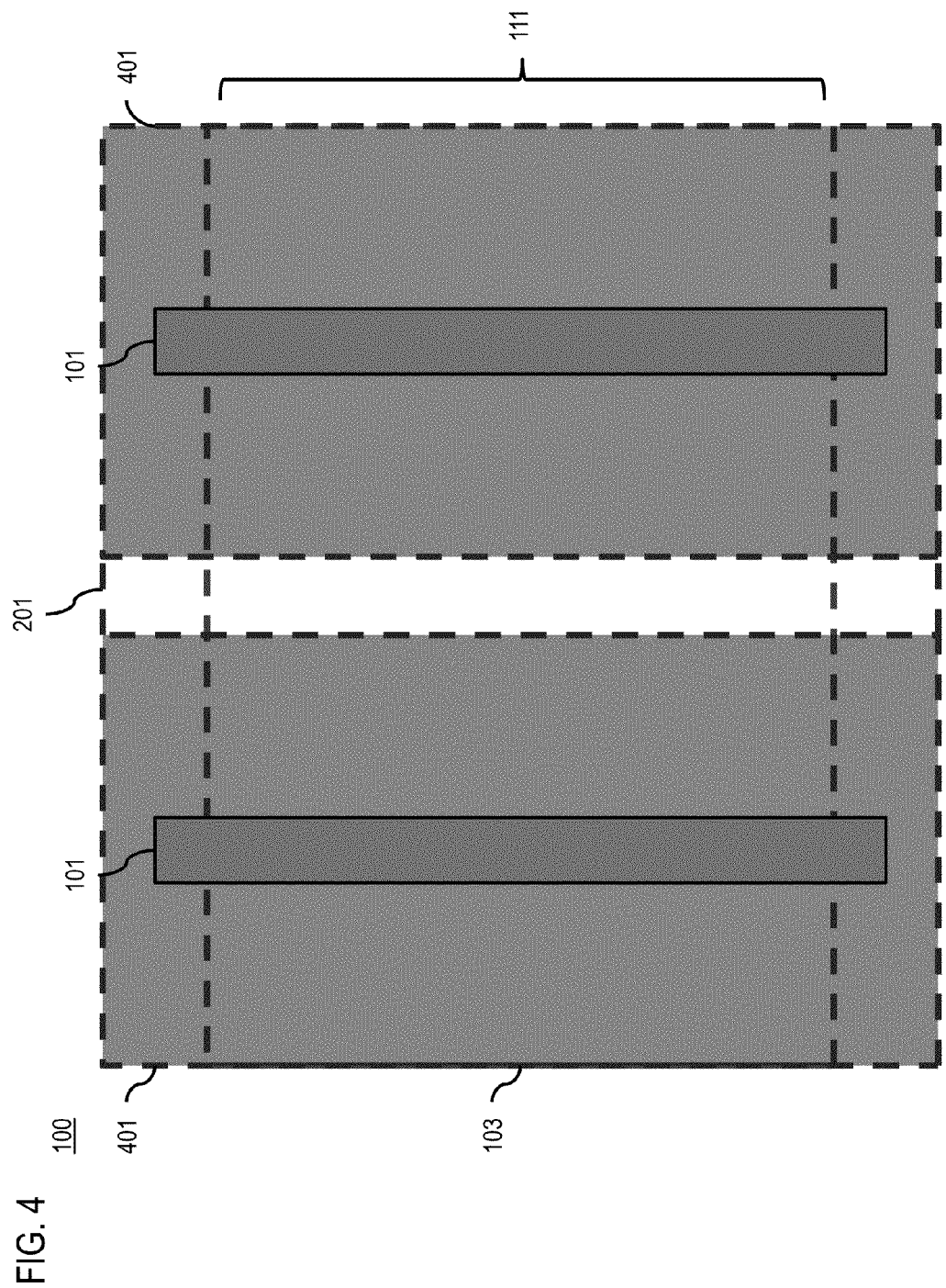

As shown in FIG. 4, the TB region 401 is the rectangular extended active region 301 (not shown) minus the extended TS 201. The TB region 401 indicates a region for a deposition preventing etching of gate electrodes 101 during a formation of a TS (e.g., TS 701) corresponding to the drawn TS 105. The designation of a TT region as the active region 103 and/or the designation of a TB region 401 enables a DRC check to determine whether the active region 103 and/or the TB region 401 causes a DRC error at a design level (e.g., prior to mask preparation). TB region 401 is a Bright Field mask with a clear background in areas with no patterns, which is compatible with lithographic processes.

Figure 5:
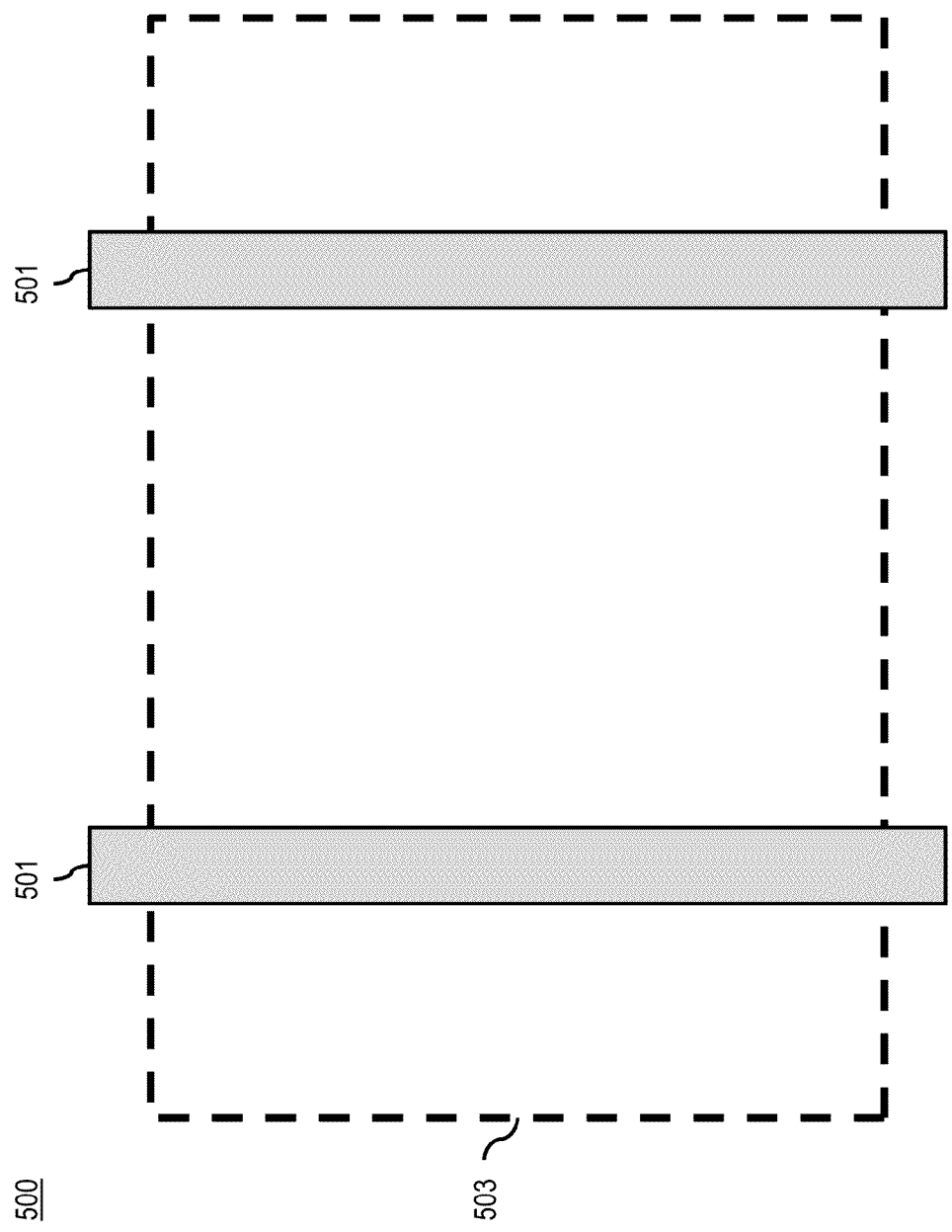
FIGS. 5 through 7 schematically illustrate a fabrication of a TS using a designated TT region and a designated TB region covering an entire upper surface of gate electrodes, in accordance with an exemplary embodiment.
Figure 6:
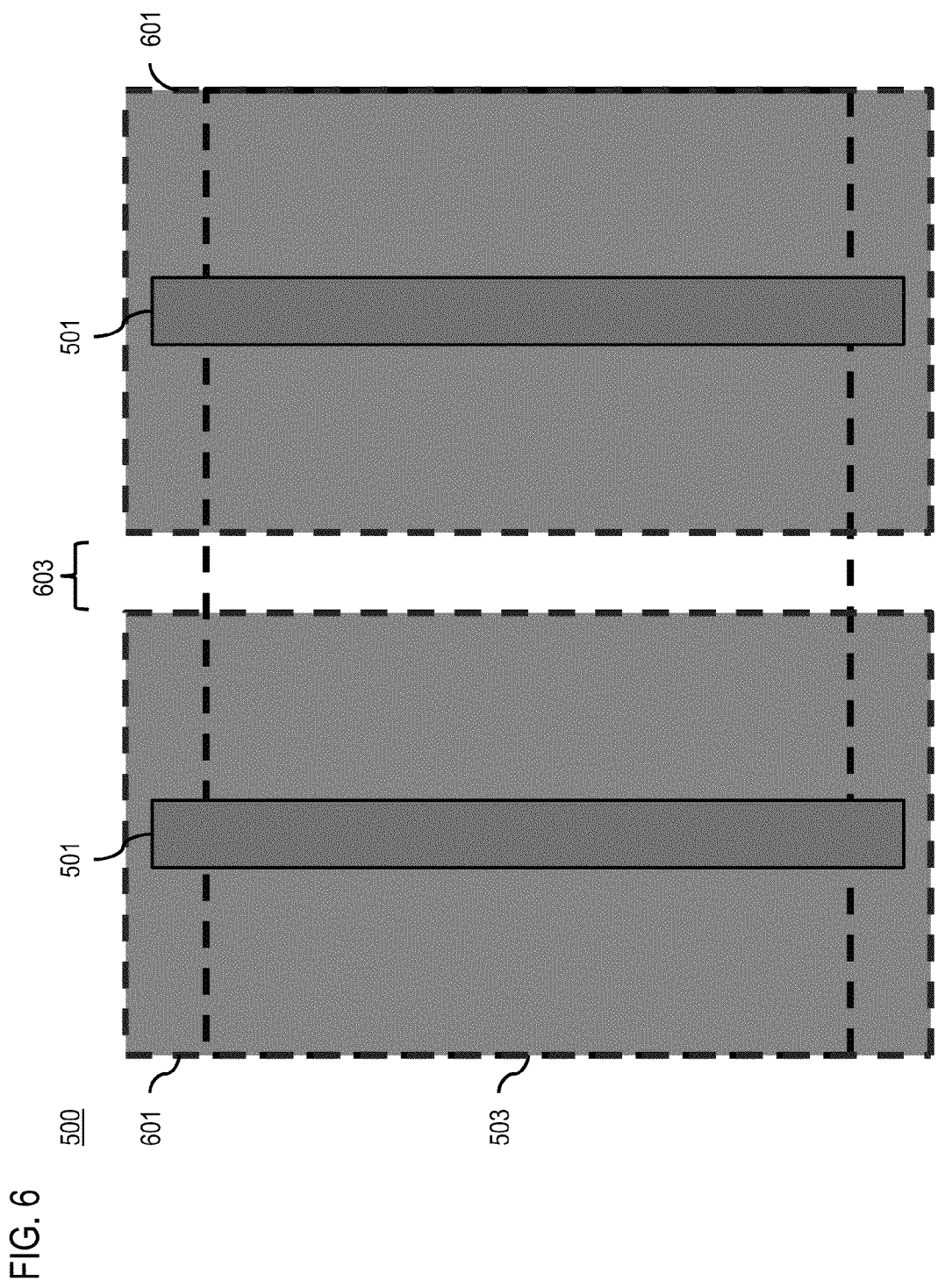
Figure 7:
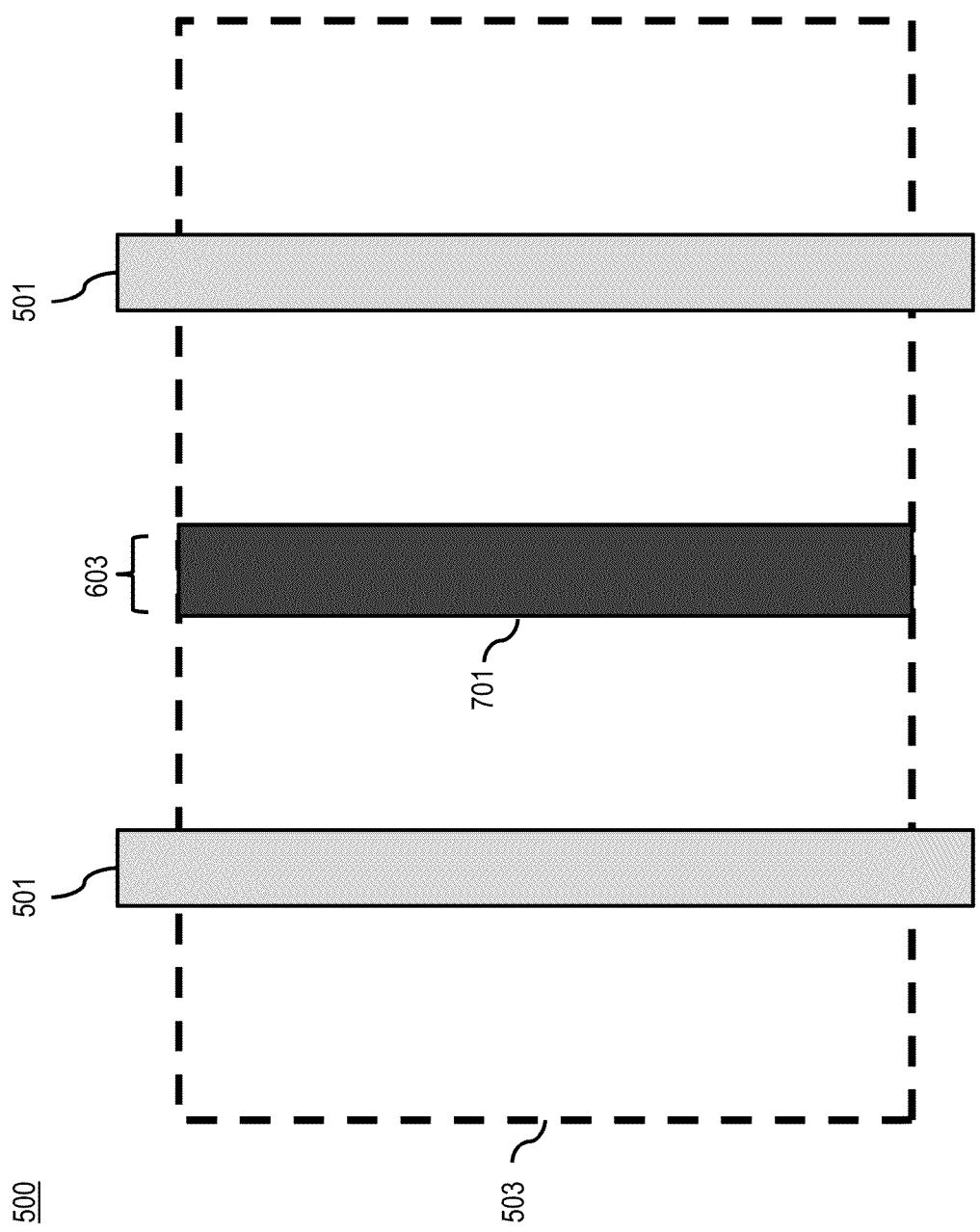

FIGS. 5 through 7 illustrate a fabrication using a designated (or drawn) TT region (e.g., RX region 103), a designated (or drawn) TB region (e.g., TB region 401), and a drawn TS (e.g., drawn TS 105). FIG. 5 illustrates a substrate 500 having gate electrodes 501 formed overlying TT region 503, designated, for example, using the steps illustrated in FIGS. 1 through 4. As shown, the TT region 503 includes an area between only a portion of facing sides of the gate electrodes 501.

Next, as shown in FIG. 6, a TB 601, designated, for example, using the steps illustrated in FIGS. 1 through 4, is formed over gate electrodes 501. As shown, the TB 601 is sized to prevent corner rounding of the gate electrodes 501 by covering an entire upper surface of gate electrodes 501. For example, TB 601 is sized to exclude an extended TS 603 region between the gate electrodes 501 to enable the formation of a trench for opening S/D regions for the TS, thereby preventing corner rounding of gate electrodes 501. Additionally, TB 601 may mask part of substrate 500 and the gate electrodes 501 from reactive ion etching (RIE) during RX contact formation post TS processing, to prevent the contact from touching the gates.

Adverting to FIG. 7, a TS is provided on the TT region 503, and the TB 601 blocks the TS from forming on portions of the substrate covered by TB 601 to form TS 701. As shown, the TS 701 is formed on the substrate 500 only within the extended TS 603 region. The TB 601 is then removed and TS 701 may then be annealed to form a metal silicide. The TS 701 may be formed using DPT with the TT region 503 and the TB 601 being generated in the same layer using different exposures. Additionally, the steps previously described allow a size of TS 701 on substrate 500 to be smaller than traditional methods, resulting in an improved fabricated device. For instance, TS 701 as illustrated allows for a reduction in a number of TS chunks compared with traditional methods in which large RX chunks were formed, resulting in TT chunks (as TT was based solely on RX), which in turn led to TS chunks because of there being no TB to block the TT chunks. The reduction in TS chunks enables a more robust Chemical Mechanical Polishing (CMP) process. Additionally, the steps illustrated in FIGS. 1 through 7 enable an effective width of transistors of a resulting device to be maximized by utilizing TS stripes, such as, for instance, TS 701. Further, a DPT scheme may be used with the steps illustrated in FIGS. 1 through 7, allowing for a reduction in critical distance (CD) and a pitch of the resulting design while maintaining performance and reliability of a resulting device. It is noted that a pitch split on TT, TB, or both may be used in the steps illustrated in FIGS. 1 through 7 to enable a LELELE process for fabrication of a resulting device.

FIG. 8 is a diagram of a chip set that can be used to implement various exemplary embodiments. Chip set 800 is programmed to determine and designate a TB region (and TT region) as described herein and includes, for instance, the processor and memory components described with respect to FIG. 8 incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in exemplary embodiments the chip set can be implemented in a single chip. Chip set 800, or a portion thereof, constitutes a means for performing one or more steps of FIGS. 1 through 7.

The chip set 800 may include a communication mechanism such as a bus 801 for passing information among the components of the chip set 800. A processor 803 has connectivity to the bus 801 to execute instructions and process information stored in, for example, a memory 805. The processor 803 may include one or more processing cores with each core configured to perform independently. A multi-core processor enables multiprocessing within a single physical package. Examples of a multi-core processor include two, four, eight, or greater numbers of processing cores. Alternatively or in addition, the processor 803 may include one or more microprocessors configured in tandem via the bus 801 to enable independent execution of instructions, pipelining, and multithreading. The processor 803 may also be accompanied by one or more specialized components to perform certain processing functions and tasks such as one or more digital signal processors (DSP) 807, or one or more application-specific integrated circuits (ASIC) 809. A DSP 807 typically is configured to process real-world signals (e.g., sound) in real time independently of the processor 803. Similarly, an ASIC 809 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The processor 803 and accompanying components have connectivity to the memory 805 via the bus 801. The memory 805 includes both dynamic memory (e.g., RAM, magnetic disk, writable optical disk, etc.) and static memory (e.g., ROM, CD-ROM, etc.) for storing executable instructions that when executed perform the inventive steps described herein. The memory 805 also stores the data associated with or generated by the execution of the inventive steps.

The embodiments of the present disclosure can achieve several technical effects, including fabrication of a circuit utilizing DPT and DRC error checking prior to fabrication by using a designated TS region in designating TT and TB regions. The present disclosure enjoys industrial applicability in any circuit design having TS, particularly formed by gate last processes utilizing DPT for 20 nm and 14 nm manufacturing technologies and below.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   determining a trench silicide (TS) region having a placement and shape, the TS region having a shape having a first horizontal dimension and a first vertical dimension;
   determining an active region including the TS region;
   determining an extended TS region including the TS region and an extension portion in the horizontal and vertical directions, adjacent each edge of the TS region; and
   determining, by a processor, a trench blocking (TB) region based on the active region and the extended TS region, wherein the TB region indicates a region for a mask configured to block a TS from forming on portions of a substrate covered by the mask.

2. The method according to claim 1, further comprising determining a rectangular extended active region including the active region and the extended TS region.

3. The method according to claim 2, wherein the TB region comprises the rectangular extended active region minus the extended TS region.

4. The method according to claim 2, wherein the rectangular extended active region is the smallest rectangle that encompasses both the active region and the extended TS region.

5. The method according to claim 1, further comprising determining one or more gate electrode regions each having a second vertical dimension, wherein the extended TS region has a third vertical dimension greater than the second vertical dimension.

6. The method according to claim 5, wherein the TB region further indicates a region for a deposition preventing etching of the one or more gate electrodes regions during a formation of a TS.

7. The method according to claim 1, wherein the active region has a second vertical dimension equal to the first vertical dimension of the TS region.

8. The method according to claim 1, wherein the TS region is designated for exposure by a first mask in a layer, and the TB region is designated for exposure by a second mask in the layer.

9. The method according to claim 8, further comprising determining whether a TS formed in the TS region and/or a mask formed in the TB region cause a design rule check (DRC) error.

10. A method comprising:
    forming first and second gate electrodes on a substrate;
    providing, by a processor, a mask on the substrate, the mask covering an entire upper surface of each of the first and second gate electrodes and an extension portion adjacent each edge of each of the first and second gate electrodes and having an opening in a first region of the substrate between the first and second gate electrodes; and forming a trench silicide (TS), after providing the mask, in the first region, wherein the mask is configured to block the TS from forming on portions of the substrate covered by the mask.

11. The method according to claim 10, comprising:
forming the TS in a portion of the first region which is also a portion of a second region of the substrate, the second region comprising a rectangular area overlying a portion of the mask and a portion of the first region.

12. The method according to claim 11, wherein the second region excludes a portion of an area between the facing sides of the first and second gate electrodes.

13. The method according to claim 12, wherein the second region is a trench transfer (TT) region corresponding to an active region associated with the first and second gate electrodes.

14. The method according to claim 10, comprising:
removing the mask, after formation of the TS; and
forming a metal salicide in the TS, after removal of the mask, by depositing a metal reacting with the substrate through a thermal anneal operation.

15. The method according to claim 10, wherein the TS is formed in an area corresponding to a drawn TS region associated with the first and second gate electrodes.

16. The method according to claim 10, wherein the mask is a trench block (TB) associated with the first and second gate electrodes.

17. A method comprising:
determining a trench silicide (TS) region having a placement and shape, the shape having a first horizontal dimension and a first vertical dimension;
determining an active region including the TS region, the active region having a second vertical dimension equal to the first vertical dimension of the TS region;
determining an extended TS region including the TS region and an extension portion in the horizontal and vertical directions, adjacent each edge of the TS region; and
determining, by a processor, a trench blocking (TB) region based on the active region and the extended TS region, wherein the TB region indicates a region for a mask configured to block a TS from forming on portions of a substrate covered by the mask.

18. The method according to claim 17, further comprising:
determining a rectangular extended active region as a smallest rectangle that encompasses both the active region and the extended TS region, wherein the TB region comprises the rectangular extended active region minus the extended TS region.

19. The method according to claim 17, further comprising determining one or more gate electrode regions each having a third vertical dimension, wherein the extended TS region has a fourth vertical dimension greater than the third vertical dimension, wherein the TB region further indicates a region for a deposition to prevent etching of the one or more gate electrodes regions during a formation of a TS.

20. The method according to claim 17, wherein the TS region is designated for exposure by a first mask in a layer, the TB region is designated for exposure by a second mask in the layer, the method further comprising determining whether a TS formed in the TS region and/or a mask formed in the TB region cause a design rule check (DRC) error.

* * * * *